United States Patent
Manson

(10) Patent No.: US 7,337,154 B2
(45) Date of Patent: Feb. 26, 2008

(54) METHOD FOR SOLVING THE BINARY MINIMIZATION PROBLEM AND A VARIANT THEREOF

(75) Inventor: Steven J Manson, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 421 days.

(21) Appl. No.: 10/838,560

(22) Filed: May 4, 2004

(65) Prior Publication Data

US 2004/0249772 A1 Dec. 9, 2004

Related U.S. Application Data

(60) Provisional application No. 60/471,580, filed on May 19, 2003.

(51) Int. Cl.
G06F 15/18 (2006.01)
G06F 17/50 (2006.01)
G06N 3/00 (2006.01)
G06N 3/12 (2006.01)

(52) U.S. Cl. .............................. 706/13; 706/921; 716/2

(58) Field of Classification Search ................. 706/13, 706/45, 52, 59, 900, 919, 921, 932; 716/2
See application file for complete search history.

(56) References Cited

U.S. PATENT DOCUMENTS 5,572,436 A * 11/1996 Dangelo et al. ............. 716/18
7,096,206 B2 * 8/2006 Hitt ............................ 706/13

FOREIGN PATENT DOCUMENTS

WO  WO 02/075650 A2  9/2002

OTHER PUBLICATIONS

Coello,C.A.C. et. al. "Evolutionary Multiobjective Design of Combinational Logic Circuits" Proceedings of the Second NASA/DoD Workshop on Evolvable Hardware. IEEE Computer Society. 2000.*
Shapiro,V. "Well-formed set representations of solids". International Journal of Computational Geometry and Applications (IJCGA). 1997.*
Yasunaga,M et. al. "Genetic Algorithm-Based Design Methodology for Pattern Recognition Hardware". Proc. Int. Conf. on Evolvable Systems (Springer LNCS No. 1801) pp. 264-273, Edinburgh, Apr. 2000.*
Nemer-Preece,N. et. al. "Parallel Genetic Algorithm to solve the Satisfiability Problem". Proceedings of the 1998 ACM symposium on Applied Computing . 1998.*
Torresen,J. "Possibilities and Limitations of Applying Evolvable Hardware to Real-World Applications". 2000.*

(Continued)

*Primary Examiner*—David Vincent
*Assistant Examiner*—Benjamin Buss
(74) *Attorney, Agent, or Firm*—Noblitt & Gilmore, LLC.

(57) ABSTRACT

A recursive binary splitting and recombination procedure coupled with a specially tailored genetic algorithm provides a solution to the general binary minimization problem with much lower run times than other methods. A minor modification to the procedure solves a variant of the binary minimization problem using an alternate operator logic that is crucial to solving certain combinatorial geometry problems.

37 Claims, 17 Drawing Sheets

OTHER PUBLICATIONS

Wang,W. et. al. "Design of Multivalued Circuits using Genetic Algorithms" Proceedings of the 26th International Symposium on Multiple-Valued Logic (ISMVL '96). 1996.*

Nilagupta, Pradonet, Logic function minimizing base on transistor count using genetic algorithm, Jan. 31, 2003, XP002339056 Information and Computer Engineering.

WORKSHOP 2003, retrieved from the Internet on Aug. 3, 2005.

Coello Coello, Carlos A. et al., Evolutionary multiobjective design of combinational logic circuits, Evolvable Hardware, 2000. IEEE 2000, pp. 161-170, Palo Alto CA US.

ISBN: 0-7695-0782-X.

* cited by examiner

Fig. 1a

| Row | A | B | C | D | E | F |
|---|---|---|---|---|---|---|
| 1 | T | T | F | T | T | T |
| 2 | T | F | F | T | F | T |
| 3 | T | T | F | T | F | T |
| 4 | T | F | F | T | F | F |
| 5 | T | T | F | F | F | F |
| 6 | T | T | F | F | F | T |
| 7 | T | T | T | T | F | F |
| 8 | T | T | T | T | F | T |

Fig. 1b

| Row | A | B | C | D | E | F |
|---|---|---|---|---|---|---|
| 1 | F | F | F | T | T | F |
| 2 | F | T | F | T | T | T |
| 3 | F | T | T | T | T | T |
| 4 | T | F | T | T | T | T |
| 5 | T | T | T | T | T | T |
| 6 | F | F | T | T | F | T |
| 7 | F | T | T | T | F | F |
| 8 | T | F | F | F | F | T |
| 9 | T | T | F | F | F | T |
| 10 | F | F | F | F | F | F |
| 11 | F | T | T | F | F | F |
| 12 | F | F | F | F | F | F |
| 13 | F | F | F | F | F | T |
| 14 | T | T | F | F | F | T |
| 15 | F | T | T | T | T | F |

Fig. 2a

| Row | A | B | C | D | E |
|---|---|---|---|---|---|
| 1+3+5+6+7 | T | T | F | | |
| 2+3+4+7+8 | T | | | T | F |

Fig. 2b

| Row | A | B | C | D | E |
|---|---|---|---|---|---|
| 1 | T | T | F | T | F |
| 2+3+4+7+8 | | | | | |
| 5+6 | | T | | F | F |

Seed Organism 94

| Row | Column A | B | C | D | E |
|---|---|---|---|---|---|
| 1 | 1 | 1 | -1 | 1 | 1 |
| 2 | 1 | -1 | -1 | 1 | -1 |
| 3 | 1 | 1 | -1 | 1 | -1 |
| 4 | 1 | 1 | 1 | 1 | -1 |
| 5 | 1 | 1 | -1 | -1 | -1 |

Fig. 8

True 89

| Row | Column A | B | C | D | E |
|---|---|---|---|---|---|
| 1 | T | T | F | T | T |
| 2 | T | F | F | T | F |
| 3 | T | T | F | T | F |
| 4 | T | T | T | T | F |
| 5 | T | T | F | F | F |

Fig. 7c

Fig. 9a — Truth Table Test Data; True

| Row | A | B | C | D | E |
|---|---|---|---|---|---|
| 1 | T | T | F | T | T |
| 2 | T | F | F | T | F |
| 3 | T | T | F | T | F |
| 4 | T | T | T | T | F |
| 5 | T | T | F | F | F |

Fig. 9b — Non-overlapping Organism

| Row | A | B | C | D | E | Unique? |   |
|---|---|---|---|---|---|---|---|
| 1 | 1 | 1 | -1 | 0 | 1 | T | Admits 1 |
| 2 | 1 | 0 | 0 | 1 | -1 | T | Admits 2, 3, and 4 |
| 3 | 1 | 0 | 0 | 1 | -1 | F |   |
| 4 | 1 | 0 | 0 | 1 | -1 | F |   |
| 5 | 1 | 1 | -1 | -1 | 0 | F | Admits 5 |

Fig. 9c — Overlapping Organism

| Row | A | B | C | D | E | Unique? |   |
|---|---|---|---|---|---|---|---|
| 1 | 1 | 1 | -1 | 0 | 0 | T | Admits 1, 3, and 5 |
| 2 | 1 | 0 | 0 | 1 | -1 | T | Admits 2, 3, and 4 |
| 3 | 1 | 0 | 0 | 1 | -1 | F |   |
| 4 | 1 | 0 | 0 | 1 | -1 | F |   |
| 5 | 1 | 1 | -1 | 0 | 0 | F |   |

Truth Table Test Data
False

100

| Column | | | | | |
|---|---|---|---|---|---|
| Row | A | B | C | D | E |
| 1 | F | F | F | T | T |
| 2 | F | T | F | T | T |
| 3 | F | F | T | T | T |
| 4 | T | F | F | T | T |
| 5 | T | T | F | T | T |
| 6 | F | F | T | T | F |
| 7 | F | T | T | F | F |
| 8 | T | F | T | F | F |
| 9 | T | T | T | F | F |
| 10 | F | F | F | F | F |
| 11 | F | T | F | F | F |

Fig. 10a

Viable Organism

102

| Column | | | | | | |
|---|---|---|---|---|---|---|
| Row | A | B | C | D | E | Unique? |
| 1 | 1 | 1 | -1 | 0 | 0 | T |
| 2 | 1 | 0 | 0 | 1 | -1 | T Rejects all |
| 3 | 1 | 0 | 0 | 1 | -1 | F |
| 4 | 1 | 0 | 0 | 1 | -1 | F |
| 5 | 1 | 1 | -1 | 0 | 0 | F |

Fig. 10b

Non-viable Organism

104

| Column | | | | | | |
|---|---|---|---|---|---|---|
| Row | A | B | C | D | E | Unique? |
| 1 | 1 | 1 | 0 | 0 | 0 | T |
| 2 | 1 | 0 | 0 | 1 | -1 | T Accepts 5, 9 |
| 3 | 1 | 0 | 0 | 1 | -1 | F Rejects all |
| 4 | 1 | 0 | 0 | 1 | -1 | F |
| 5 | 1 | 1 | 0 | 0 | 0 | F |

Fig. 10c

METHOD FOR SOLVING THE BINARY MINIMIZATION PROBLEM AND A VARIANT THEREOF

CROSS-REFERENCE TO RELATED APPLICATIONS

This application claims benefit of priority under 35 U.S.C. 119(e) to U.S. Provisional Application No. 60/471,580 entitled "Computerized Modeling System and Method to Transform Nodal and Parametric Surface Data from CAD Product Form into Efficient, High Accuracy, Combinatorial Geometry" filed on May 19, 2003, the entire contents of which are incorporated by reference.

BACKGROUND OF THE INVENTION

1. Field of the Invention

This invention relates to the creation of a minimized binary equation that differentiates true from false given a true truth table T and its complement F.

2. Description of the Related Art

A true truth table T 10 and its complement F 12 of the type shown in FIGS. 1a and 1b can be represented as binary equations 14 and 16 of the type shown in FIGS. 2a and 2b. T and F together comprise a set of binary input values for which a single binary digit of output is desired. The input combinations appearing in T must yield an output value of "true"; the input combinations appearing in F must yield an output value "false". Any input combinations not explicitly appearing in either table may yield arbitrary output. The binary equation represents an efficient method of computing the output bit based on any given input string. Many techniques have been developed to pare down the binary equation to adequately represent a minimal mapping of the underlying system. This class of problem is referred to as "binary minimization". Binary minimization is used in many applications such as digital logic circuit design, image processing and asynchronous design.

In digital circuit design, the truth tables represent the mapping from the logical inputs to a single bit output. The construction of logic gates to test explicitly for every possible input condition and give the appropriate output according to the map is tractable, but this approach is often suboptimal. In many applications, the resulting digital logic circuit would be too large, too slow and too expensive. Binary minimization is used to pare down the tests of the input condition necessary to adequately represent a minimal mapping to the output conditions and thus a minimum number of logic gates. Typical techniques include Karnaugh mapping and the Quine-McCluskey algorithm.

The general problem has been shown to be Nondeterminiic Polynomial (NP) time complete, thus any rigorous solution using currently known techniques will have solution times increasing exponentially with the size of the truth table. This status applies to the most frequently used formulation of the problem which uses simple OR logic to tie together multiple terms of intersecting (AND) input quantities, as well as variants using XOR logic, and a special variant.

Surface based combinatorial geometry (SBCG) represents a special variant of the general problem. The SBCG format consists of unbounded analytic surfaces knitted together by zone definitions using simple intersection logic and is commonly used in nuclear radiation transport, optical design, thermal radiation transport, visual scene rendering or other general ray-tracing applications. The SBCG format assumes that each segment of space is represented once and only once in the geometrical model. Conversely, the OR logic used in typical binary minimization approaches assumes that the various terms of the minimized equation can multiply represent truth, hence overlapping spatial regions are permitted in this context. For example (1 OR 1 OR 1 OR 0) in a geometry variant represents spatial overlap which is not allowed. Only one term may be true given any specific input condition to avoid spatial overlap. Thus, the existing body of algorithms cannot be directly applied to the combinatorial geometry problem because of its atypical implementation of OR logic. Other implementations of binary minimization have been deliberately constructed to use XOR logic in place of ORs, but even this substitution will permit forbidden overlaps to arise under the combinatorial geometry framework. However, any solution of the combinatorial geometry variant of the problem will satisfy the constraints of XOR logic; it won't take advantage of potential global features of that logic.

For example, the OR logic minimization of the truth table for [a'bc+ab'c+abc'+abc]=[ab+bc+ac]. However, this solution multiply specifies the region [abc], in fact, that quantity is permitted in each of the three terms of the solution. In the combinatorial geometry interpretation of this problem, one region of space would simultaneously exist in each of three distinct combinatorial zones. This sort of spatial overlap is not permitted in the radiation codes by definition. Use of XOR logic in this context can be seen to lose coherence to the zoning of space altogether, since XOR forces the definition of each sub-region to depend collectively on the definitions of all of them (one might ask to which term in [ab⊕bc⊕ac] abc belongs). The solution of the original problem under the combinatorial geometry variant, [ab+a'bc+ab'c], not only meets the needs of that logic set; it satisfies the requirements for a Boolean XOR solution as well.

There remains a need for an expedient calculation of a sufficient but not necessarily optimum solution for the general binary minimization problem. Furthermore, there remains a need for a solution to the combinatorial geometry variant of the binary minimization problem.

SUMMARY OF THE INVENTION

The present invention provides a method of determining sufficient (but not necessarily optimum) solutions to the binary minimization problem in the standard (OR logic) form with much lower run times than other methods. Furthermore, a minor modification allows the method to solve a variant of the binary minimization problem using an alternate operator logic that is crucial to solving certain combinatorial geometry problems.

This solution method consists of a recursive binary splitting and recombination procedure, coupled with a specially tailored genetic algorithm. More specifically, this binary minimization algorithm is a comprehensive way of iteratively subdividing the true truth table T into sub-tables, solving each of the sufficiently small pieces independently for minimized binary sub-equations using a genetic algorithm, regressing back through the decomposition process to apply the genetic algorithm to reunited sub-tables and repeating the solution procedure with each reunited truth table until a minimized binary equation has been determined for the entire reunited truth-table.

In one exemplary implementation, the method has been configured to solve the combinatorial geometry variant of the binary minimization problem using an algorithm that specifically tests for overlaps during the solution process. This algorithm employs several mitigation procedures to prevent, correct, and eliminate overlaps. These steps are discussed in context below.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 1a and 1b, as described above, are examples of a true truth-table T and its complement false truth-table F;

FIG. 2, as described above, is an example of a binary equation that differentiates true from false given the T and F truth-tables;

FIGS. 7a through 7c are diagrams of the process for simplifying the sub-tables;

FIG. 8 is a diagram of a trinary seed organism;

FIGS. 9a through 9c are diagrams of a T truth table and the viable and non-viable organisms for the combinatorial geometry variant;

FIGS. 10a through 10c are diagrams of a F truth table and the valid and non-valid organisms;

DETAILED DESCRIPTION OF THE INVENTION

Binary minimization entails the development of a Boolean equation with an acceptably small number of terms, using as few as practicable inputs to each term, in order to represent the input/output mapping of the truth table. This binary minimization algorithm is a comprehensive way of iteratively subdividing the true truth table T into sub tables, solving each of the sufficiently small pieces independently for minimized binary sub-equations using a genetic algorithm, regressing back through the decomposition process to apply the genetic algorithm to reunited sub-tables and repeating the solution procedure with each reunited truth table until a minimized binary equation has been determined for the entire reunited truth-table. This process provides an efficient solution to the general binary minimization problem and a solution to the combinatorial geometry and XOR variants.

Figure 3:
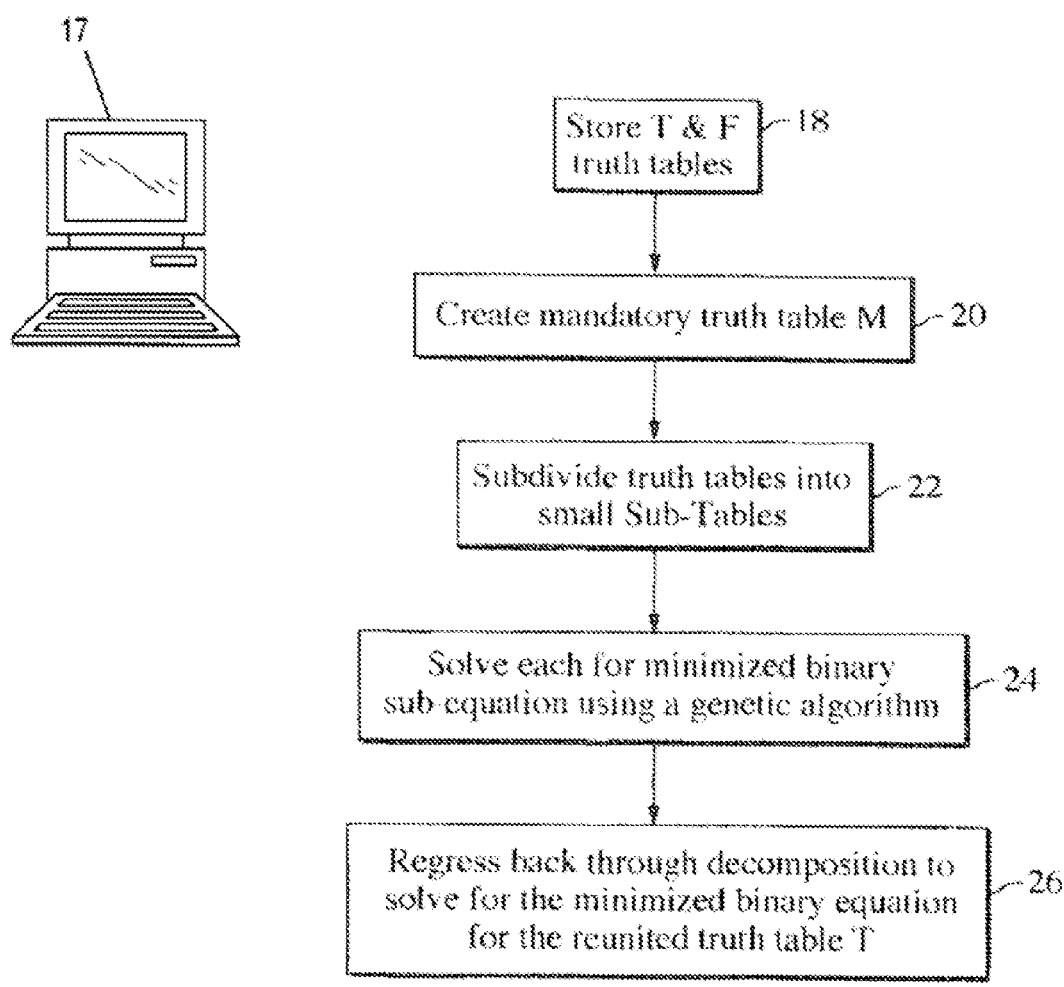
FIG. 3 is a flowchart of the method for solving a variant of the binary minimization problem in accordance with the present invention.

As shown in FIG. 3, the process for designing a digital logic circuit implemented on a computer 17 begins with a pair of complementary truth tables T and F stored therein (step 18). A mandatory table M can be computed ("Mandatory Table Creation" routine) for truth table T. Table M includes true-valued entries that denote each truth table entry which is absolutely necessary in order for the solution to be well-posed (step 20). A "Break" routine iteratively bisects the truth-table into smaller and smaller sub-tables (step 22). A "Zoner" routine operates on the lowest level sub-tables, computing minimized binary sub-equations for each using a genetic algorithm (step 24). A "Rebuild" routine iteratively recombines bisected truth tables starting at the lowest level and working backwards (step 26). Using the binary sub-equations from the lower level sub-tables, Rebuild further refines the minimized binary equation at the next higher level. When complete, Rebuild produces a single minimized binary equation representing the minimized truth table for the entire problem. This procedure not only outperforms other solution procedures as applied to the whole truth table (simultaneously) in terms of the solution time, it typically arrives at a more optimal solution as well. Furthermore, while some methods are known to allow solutions that are not well-posed, this one is guaranteed to provide a valid solution when implemented properly. This process has an added advantage of providing a valid solution at every uniting iteration following the solution of all the smallest sub-tables. Thus for any problems that are so complicated that the final uniting steps are too time-consuming to bother with, a valid solution can be gleaned from the output at any intervening time.

Mandatory Table Creation

Figure 4:
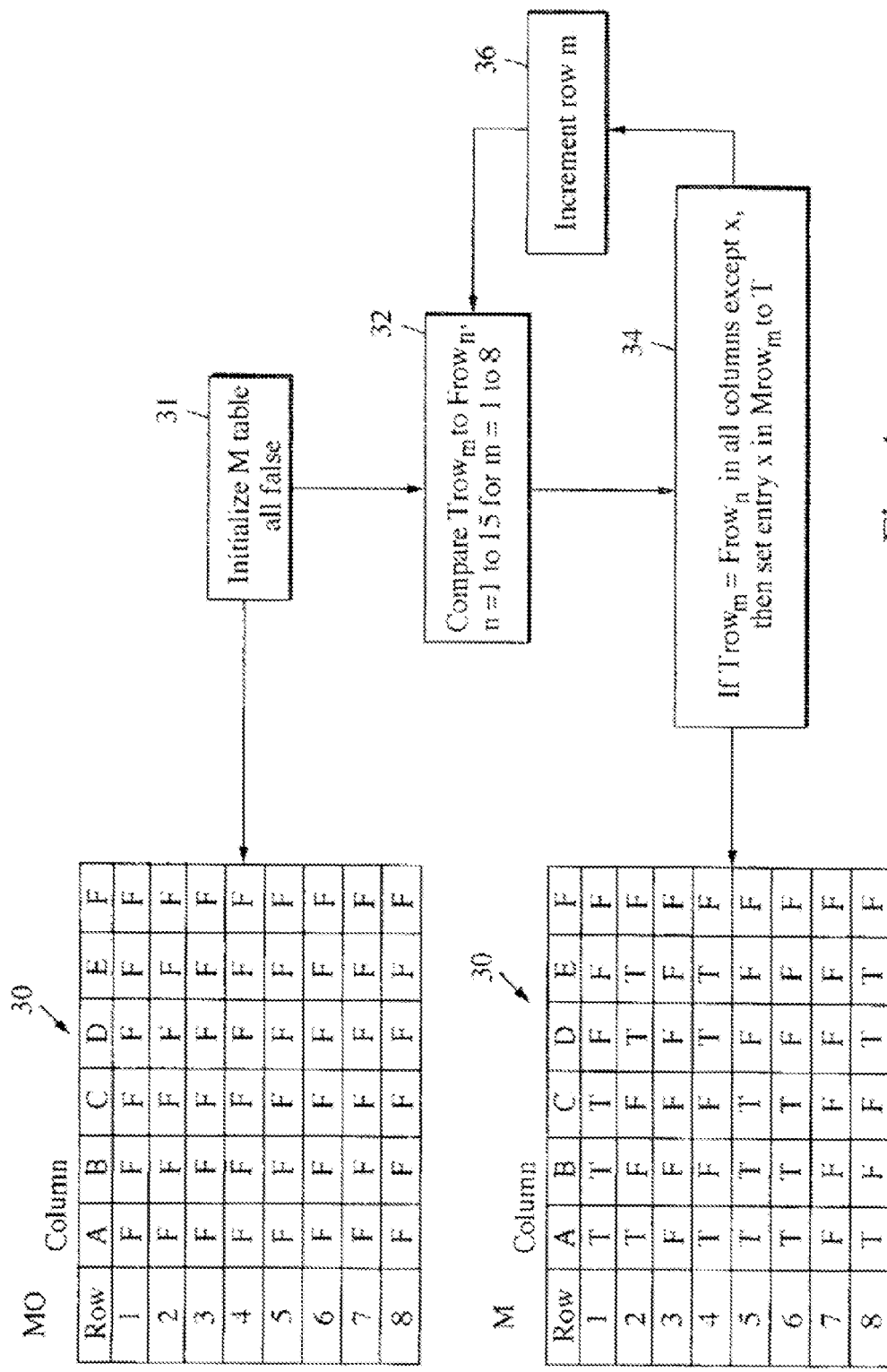
FIG. 4 is a diagram of the process for generating a mandatory table M.

It is frequently helpful (though not necessary for this process) to pre-compute the truth table entries which are absolutely necessary in order for the solution to be valid. As shown in FIG. 4, this is done by creating a mandatory table M 30 in which all the entries are initially false (step 31). The rows of the truth table T are compared one-by-one to each row of the truth table F (step 32). If ever a pair of such rows is found to differ by only one entry, that that entry must always be maintained in any trial solution for the solution to be valid. Accordingly, that entry in the M table 30 is set to true (step 34). If ever such an entry were deleted, there would be nothing to distinguish a true from false for a portion of the problem. The row is incremented and the process repeated until M table 30 is complete (step 36).

Break

At the beginning of the bisection process it is expected that a complete set of input data have been specified. This input data must include at least two truth tables: the first represents the explicit known input set that results in [true] valued output; the second represents the explicit known input set that results in [false] valued output. These tables are not required to be complete; that is, together they do not have to represent every possible Boolean combination of the columnar input values. It is often the case in these problems that certain combinations of inputs will not be possible; therefore it would limit the framework of this solution procedure to require exhaustively complete tables. The input may also include the mandatory truth tables M. These mandatory entries can also be provided to the bisection procedure, which can reformulate them as the problem is bisected, and pass the required information down the tree as the algorithm proceeds.

The selection of a bisecting column may be accomplished in a variety of ways. In the simplest scheme, each column of the truth table is evaluated to determine which column most evenly splits the problem in two. If, for example we know that the truth table has 100 rows and 7 columns, and each column has a total of [true] valued entries numbering: (3,20,12,89,56,76,22), respectively, then column 5 is selected since 56 is nearest to 50, which would be the most nearly even possible division. As the input may also include an a priori ranking of columns for selection as bisectors, this information may be used to augment the choice of bisecting surface. Finally, a set of logical bisection candidates may be calculated as the algorithm proceeds, these have proven to provide very robust selection criteria for bisecting surfaces. Logical bisection candidates are calculated by determining the number of [true] entries in the M table corresponding to the truth table (or sub-table) to be bisected. Good candidate columns are identified as having more than the mean number of [true] M entries. Finally a single bisecting column is chosen from the candidate list by determining which of these (as above) most nearly divides the table into two equally sized groups of rows.

Once a bisecting column is selected, the bisection process produces sub-tables TA and TB for the T table by splitting T according to the values in the bisecting column. Two sub-tables FA and FB are produced by copying table F twice and appending TB onto FA, and TA onto FB. The M table is split into sub-tables to correspond to TA and TB. Finally, the computer simplifies the sub-tables, the complements and the M sub-tables. All of the tables are stored and the process repeated recursively for each sub-table until they all are sufficiently small.

Figure 5:
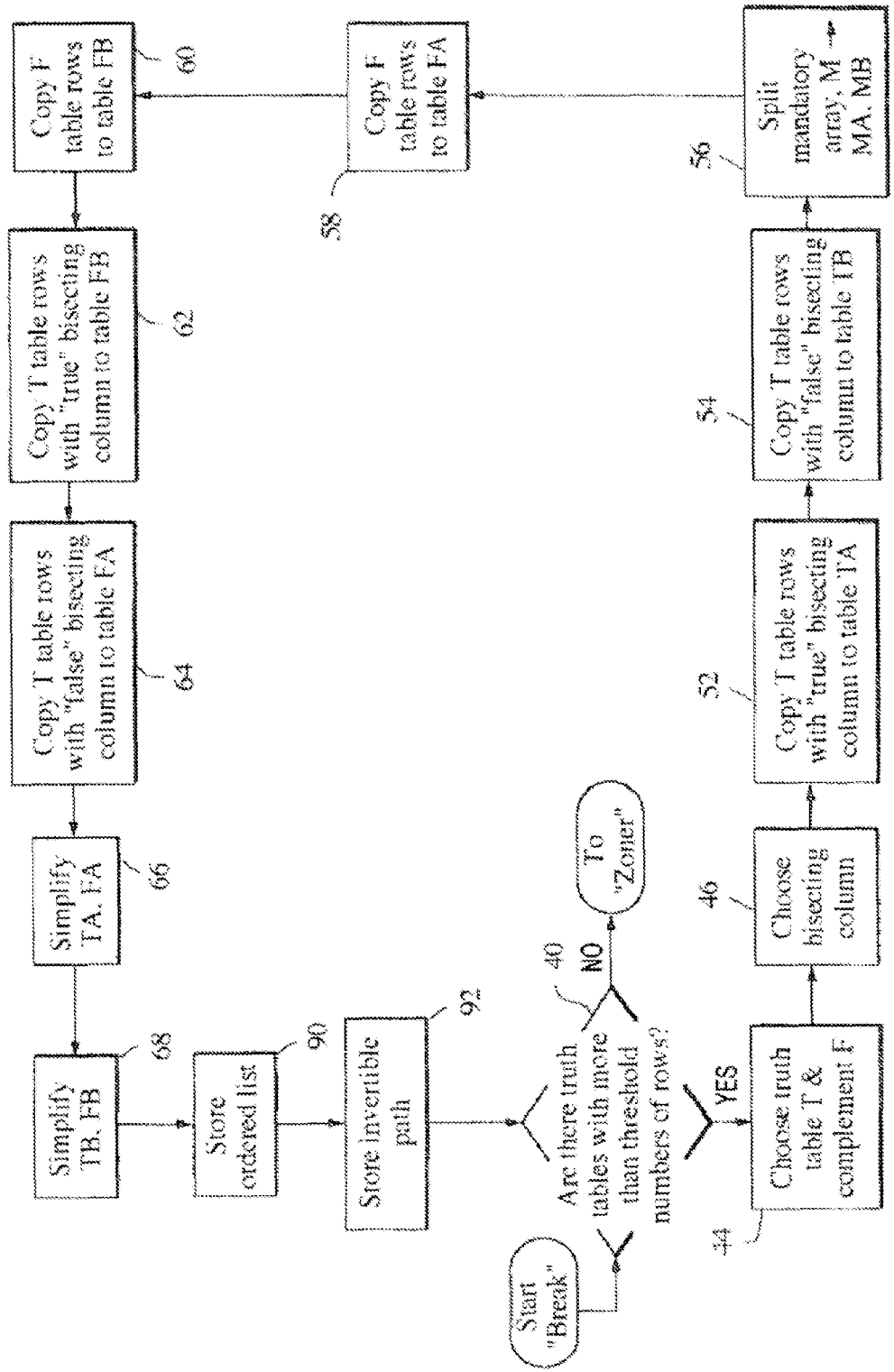
FIG. 5 is a flowchart of the "Break" subroutine for sub-dividing the truth tables into sufficiently small sub-tables.
Figure 6:
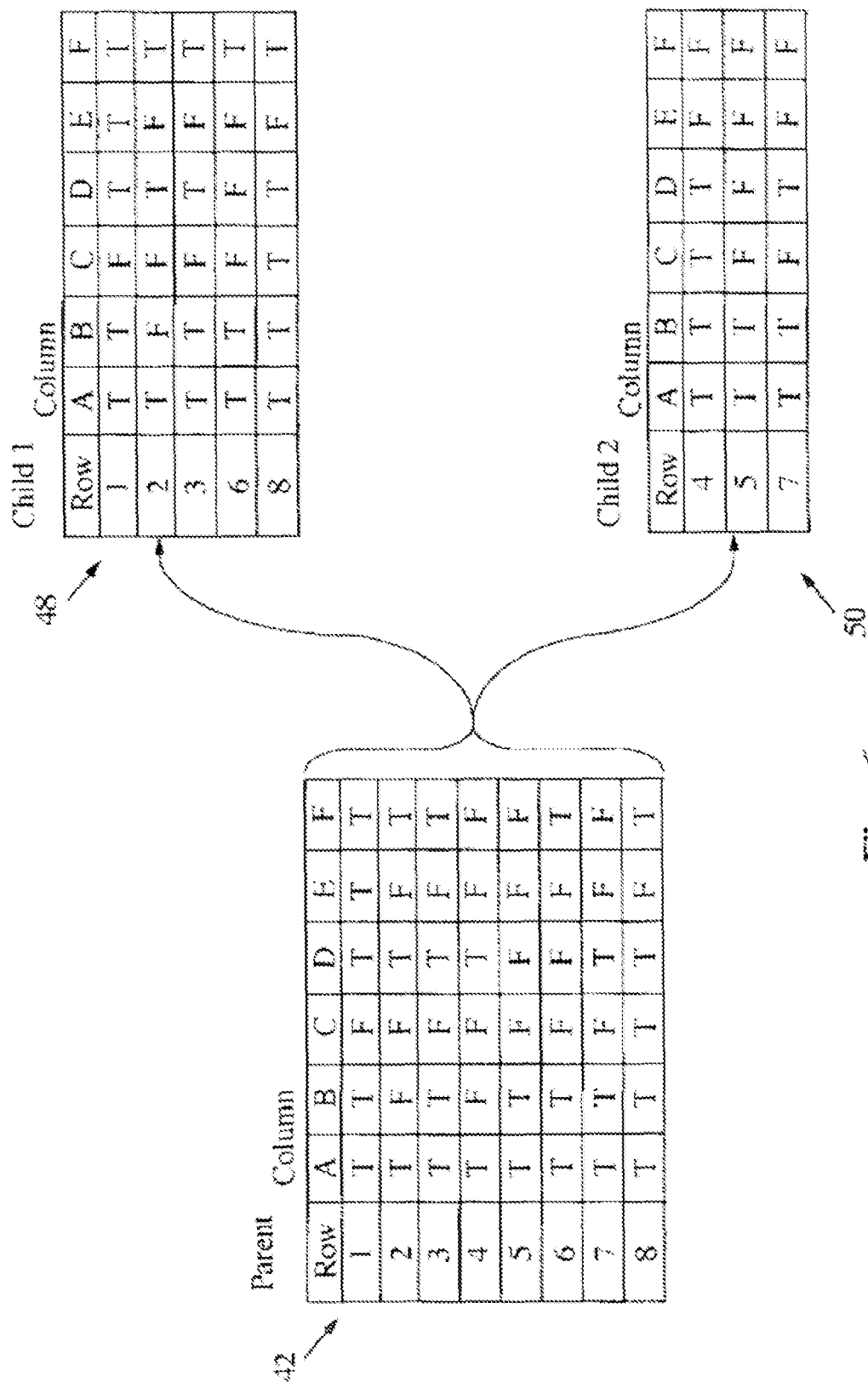
FIG. 6 is a diagram of the process for generating the sub-tables.

A flowchart and graphic representation of the bisection process are shown in FIGS. 5, 6 and 7. The process is initiated by determining whether there are any remaining truth tables T with more than a threshold number of rows (step 40). The threshold can be set arbitrarily, but a suitable value of 15 has been chosen by trial and error. If there are any such tables, the process selects a truth table T 42 and its complement F (not shown) (step 44) and selects a bisecting column for truth table T (step 46). As discussed above, there are a variety of ways to choose a bisecting column, but the best practice has been demonstrated to be logical bisection using columns that have a preponderance of [true] values in the corresponding column of the M table, as well as do a reasonably good job bisecting the table. In practice this has been implemented by computing the number of M truths for each column, and picking the most even bisector from amongst the set that have more than the mean number of M truths. Also, if in the particular application there is a priori knowledge about the structure of the truth table with respect to the columnar data, a more intelligent system for choosing bisection columns can be devised; some of these schemes are presented in co-pending U.S. patent application Ser. No. 10/838,411 entitled "Automated Translation of High Order Complex Geometry from a CAD Model into a Surface Based Combinatorial Geometry Format", filed on May 4, 2004. Once the bisecting column has been chosen, splitting the larger truth table in two is performed simply by building two new smaller tables 48, 50, one is a copy of each of the rows from the original table that has [true] as the entry for the chosen column, TA (step 52). The other table gets copies of all of the rows that read [false] in the chosen column, TB (step 54). This operation is performed on the [true] valued truth table. Additionally, the array of mandatory entries, M (which has rows and columns corresponding one-for-one with the [true] truth table) can be split up into two pieces as well, each row is assigned to a sub-table corresponding to either the [true], MA, or [false], MB, side of the bisecting column, depending on whether the corresponding row of the truth table had a [true] or [false] value in that column (step 56). Two copies are made of the [false] valued truth table (FA, FB) (steps 58, 60) and one copy is assigned to each half of the [true] valued truth table. Next, additional information is appended to each of the two new copies (steps 62, 64); each table has the rows of the opposite half of the [true] valued truth table appended to it (FA=F+TB; FB=F+TA). This ensures, as the solution proceeds, that the two lower level solutions will not overlap under any condition.

Figure 7A:
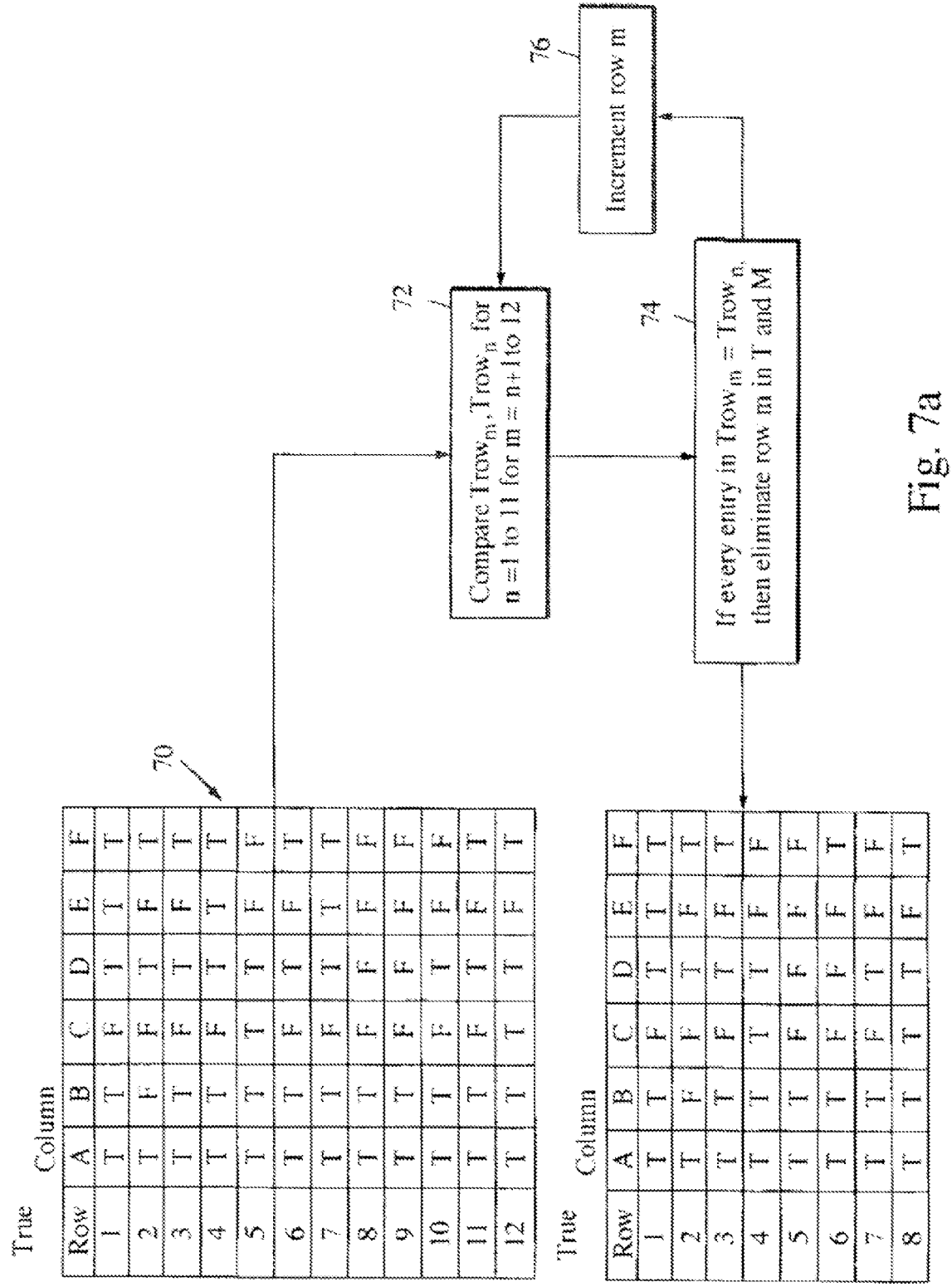
Figure 7B:
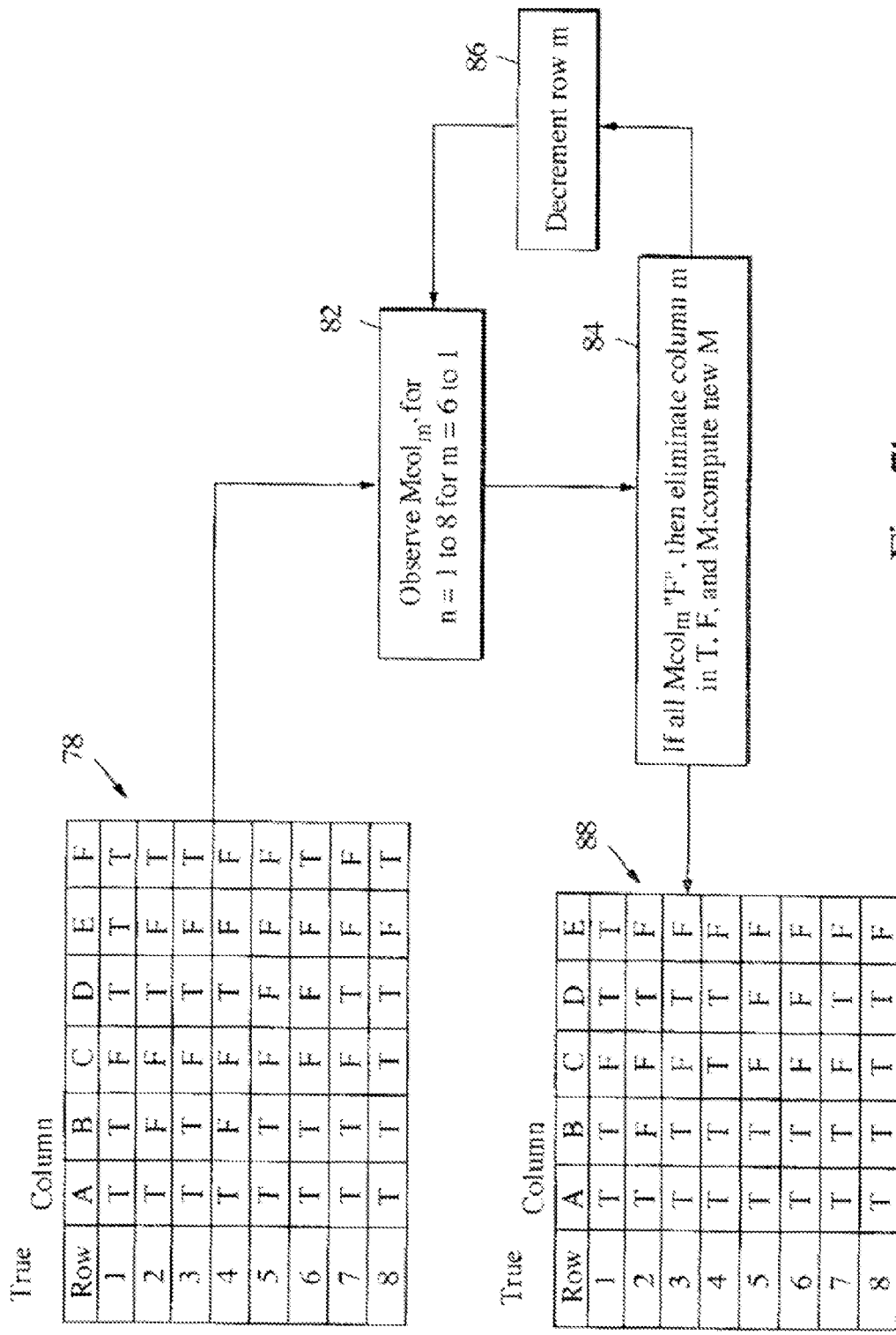

At every step of the bisection routine, copies of the truth tables are stored for later use during reconstitution. In the exemplary optimization routine the truth tables are simplified at each step (steps 66, 68) using two different operations as shown in FIGS. 7a and 7b, respectively. First, identical rows of each table are eliminated. As shown in FIG. 7a, this is generally achieved by comparing $Tcol_m$ to $Tcol_n$ for n=1 to N−1 (where N is the total number of rows) for m=n+1 to N for the T truth table 70 (step 72). If all $Tcol_m$=$Tcol_n$ then row m in the T and M tables is eliminated (step 74). Row m is incremented (step 76) and the steps repeated until a simplified T truth table 78 results. The computational load can be significantly reduced by forming a binary-tree for the truth table rows, iteratively loading each row into the tree and discarding duplicate entries whenever they are identified.

When all duplicate rows have been deleted, any unnecessary columns are eliminated. In order to determine which columns are required to represent the logical information in the table, it is necessary to perform an iterative comparison of the T and F truth tables. This logical operation is performed by considering the implications of turning off each column in turn by comparing each T row with each F row. If the absence of a column of data can cause any T row to be identical to any F row, that column is necessary to the model, hence the corresponding column is required to differentiate T and F. As shown in FIG. 7b, this result may be achieved by observing $Mcol_m$ to for n=1 to 8 for m=6 to 1 for the T truth table 78 (step 82). If all $Mcol_m$="F" then column m in the T, F and M tables is eliminated and a new mandatory table M is computed (step 84). Row m is decremented (step 86) and the steps repeated until a simplified T truth table 88 results. Again the use of binary trees vastly reduces the computational load to solve this problem. For each column considered, a new binary tree is formed with the column in question excised. This results in a process that takes on the order of $N_C*N_T*\log_2(N_F)$ row comparisons where $N_C$, $N_T$ and $N_F$ are the number of columns, the number of rows in T, and the number of rows in table F, respectively. Finally, again because the process of eliminating columns often results in new duplicates the first operation (culling duplicate rows) is repeated to produce simplified T truth table 89.

At every step an ordered list of the columns and rows (referenced to the original truth tables) which persist in the table at that point in the process is stored (step 90). In addition, some sort of invertible path structure is stored as the recursive bisection takes place (step 92), so that a map can be constructed which will allow the appropriate pairs of files to be reunited in the appropriate order leading all the way back to the original truth table construct.

Finally when the bisection process has been repeated recursively to the point where all remaining [true] valued truth tables are smaller than some threshold, i.e. step 40 is false, the desired optimization routine ("Zoner") can applied at this lowest level. Because these low level optimizations are independent of one another they may be implemented as parallel processes if desired. In the exemplary implementation of this invention a genetic algorithm is used to optimize the truth tables, but any optimization routine may be successfully used in this process.

Zoner

Before we can describe the binary minimization algorithm embodied in "Zoner", we need to introduce the properties of genetic algorithms including the creation, properties and breeding of organisms.

Genetic Representation of Boolean Equations

To implement a genetic algorithm to minimize the complexity of the binary equation represented by the truth table, it is necessary to develop a gene-like representation of potential solutions. Furthermore it is necessary to develop a method of evaluating the fitness of the potential solutions in terms of their performance.

The genetic code employed suggests itself from the truth table form. Each entry in the truth table corresponds to a term in a Boolean equation; each row is an additive term, each column is an input variable. It isn't necessary in an optimized form, however, that each term contain a specified value for each input variable. Thus, a trinary format has been chosen for the genetic code, allowing the possibility of true (+1), false (−1), or irrelevant (0) for the value at any term/variable intersection. These individual values are referred to as "genes" in this nomenclature. The array of genes maps one for one to the original truth table; the number of columns is the same. Rows, in the genetic context are referred to as "chromosomes", and they number the same in each trial solution (or organism) as the original truth table. So if a problem has 5 input variables, a chromosome with 5 genes is encoded; the example genetic encoding (0,0,0,1,−1) represents a portion of a potential solution not using the first three input variables, and using the fourth variable in the [true] sense, and the fifth variable in the [false] sense.

As shown in FIG. 8, a "seed" organism 94 is formed by mapping the T sub-table 89 into the trinary format. The seed organism only has 1 and +1 values, 0 values will be introduced during prototyping of the seed to form an initial pool of organisms.

Properties of Organisms

The organism structure has a number of important properties. Values for these properties can be calculated given an instance of an organism and the original T and F truth tables that correspond to that organism.

Chromosome Uniqueness

An important property of an organism is the uniqueness of its chromosomes within the context of that particular individual organism. Chromosomes that are copies of other chromosomes in the organism have special status, so a separate logical array is kept corresponding to each organism; each position in that logical array corresponds to a chromosome and takes on the value [true] if the chromosome is unique, [false] if the chromosome is an exact duplicate of some other chromosome. Since the chromosomes are arranged in an ordered list, it is easy to arbitrarily construe the first instance of a chromosome as the unique instance; any following duplicates are denoted as such.

Duplicate Chromosome Chain

In the case where a chromosome genotype is duplicated at various points throughout the organism's genetic structure, it is often helpful to have an organized means of propagating any changes to the first (unique) version throughout the rest of the structure, specifically to all subsequent copies. To meet this need, a pointer array is kept associated with each organism. The default pointer value is zero, but if there are any duplicates of a given chromosome, the pointer corresponding to the first instance is set to the number of the chromosome that comprises the subsequent instance of that genotype. That instance of the chromosome will point to the next one, and so on.

Number of Non-Zero Genes in Unique Chromosomes

Another important property is the total number of non-zero genes in all the unique chromosomes combined. These can be counted in a straightforward fashion by making use of the logical array denoting chromosome uniqueness. This turns out to be a good measure of the optimization of the organism, since an optimal solution will use as few as possible column entries to define as few as possible unique rows.

Spatial Overlap

As stated above, the SBCG variant of the binary minimization problem requires that no portion of space be multiply specified; all of space must be uniquely defined as specifically residing in a single material or void region. To ensure that this condition is met when this form of the problem is solved, it is necessary to calculate the spatial overlap existing in a given solution. This is done by comparing each truth table row in turn with each chromosome to ensure that each row is consistent with only a single unique chromosome. Consistency is computed by comparing each row element with the corresponding gene; if the gene in that position is zero, consistency is maintained. If the gene's value in a given position is +1, the corresponding truth table value must be [true] in order for consistency to exist. If the gene's value is −1, the corresponding truth table entry must be [false]. If even one violation is identified, the truth table row is deemed to be inconsistent with the given chromosome. An organism is deemed to be viable as long as each T truth table row is consistent with only one unique chromosome; it is not viable if there is even one lapse.

Given a T truth table 89 as shown in FIG. 9a, an organism 96 as shown in FIG. 9b is viable because it admits each of the rows in the true sub-table 89 in one and only one chromosome but organism 98 as shown in FIG. 9c is not viable because it admits the third row in two different chromosomes, i.e. spatial locations, hence would represent a spatial overlap. Thus, in solving the variant any non-viable organisms would be given a score of zero and removed from the pool.

When the typical binary minimization form of solution is desired, this computation can be either skipped or ignored. Overlap is permitted in the traditional OR logic formulation of the problem.

Solution Validity

The other key performance feature of an individual organism is that it successfully rejects all specified F table rows. This is tested by performing the consistency check described above checking each F truth table entry against each chromosome. As long as no F truth table row is consistent with any chromosome, the organism is deemed viable for the purposes of this calculation. As shown in FIG. 10a, each entry of F truth table 100 (the complement to T truth table 89 shown in FIG. 7c) is checked against organism 102 and 104. Organism 102 as shown in FIG. 10b is valid because its unique chromosomes reject each row in the F truth table 100. Conversely, organism 104 as shown in FIG. 10c is invalid because chromosome 1 accepts both row 5 and row 9 in the F truth table.

Initial Population Generation

Figure 11A:
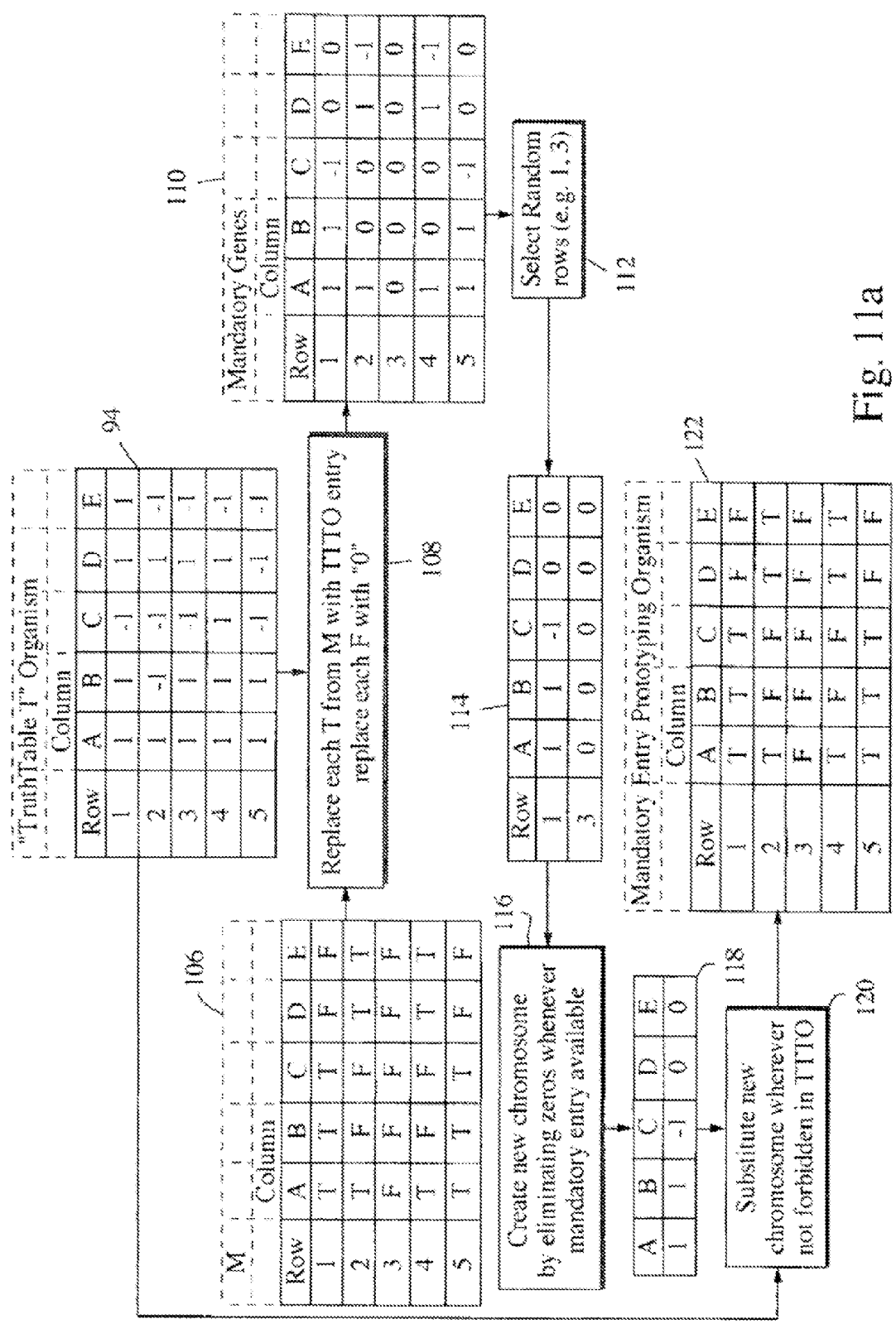
FIGS. 11a through 11c are a sequence of diagrams illustrating the prototyping of organisms.
Figure 11B:
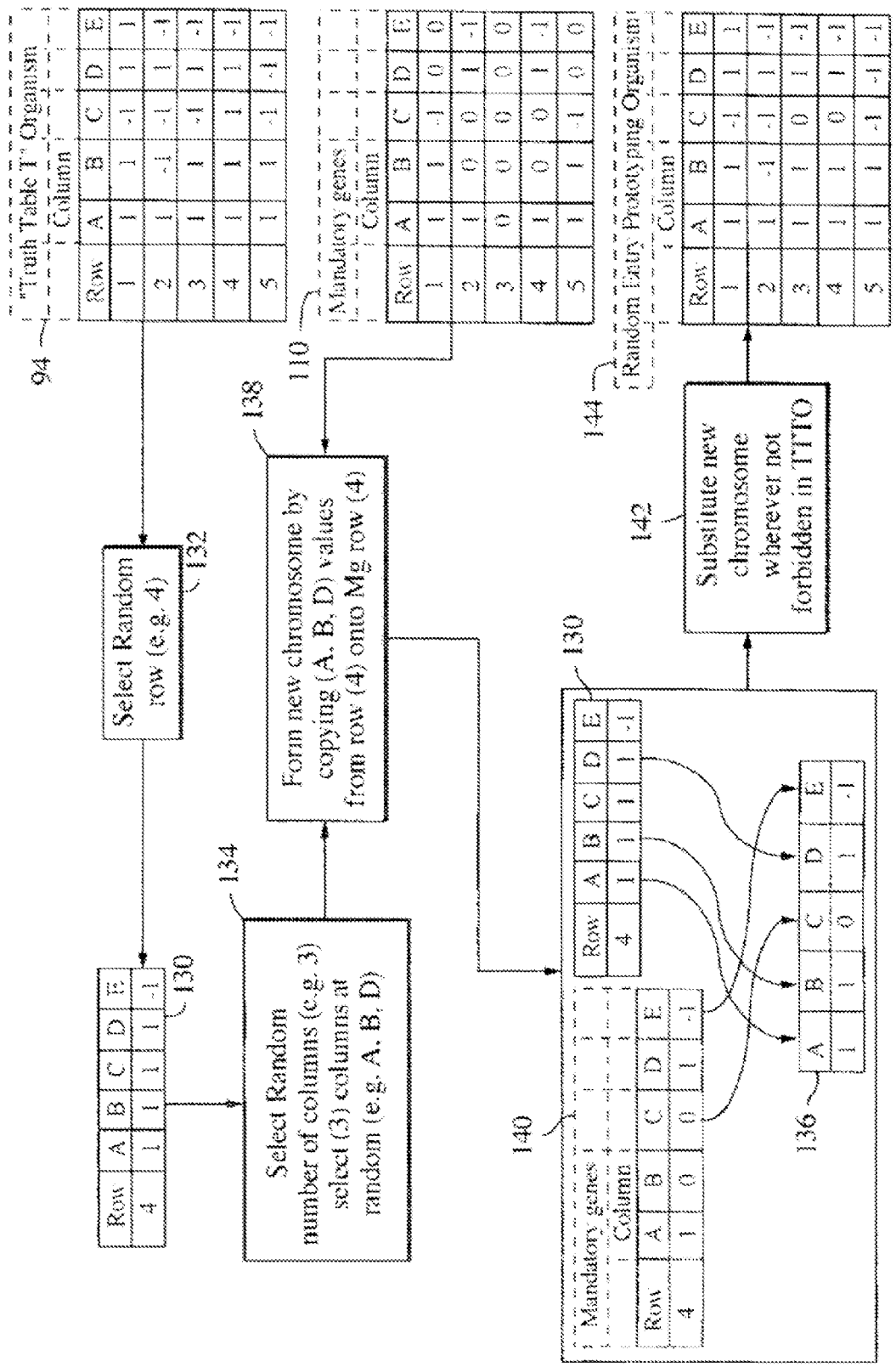
Figure 11C:
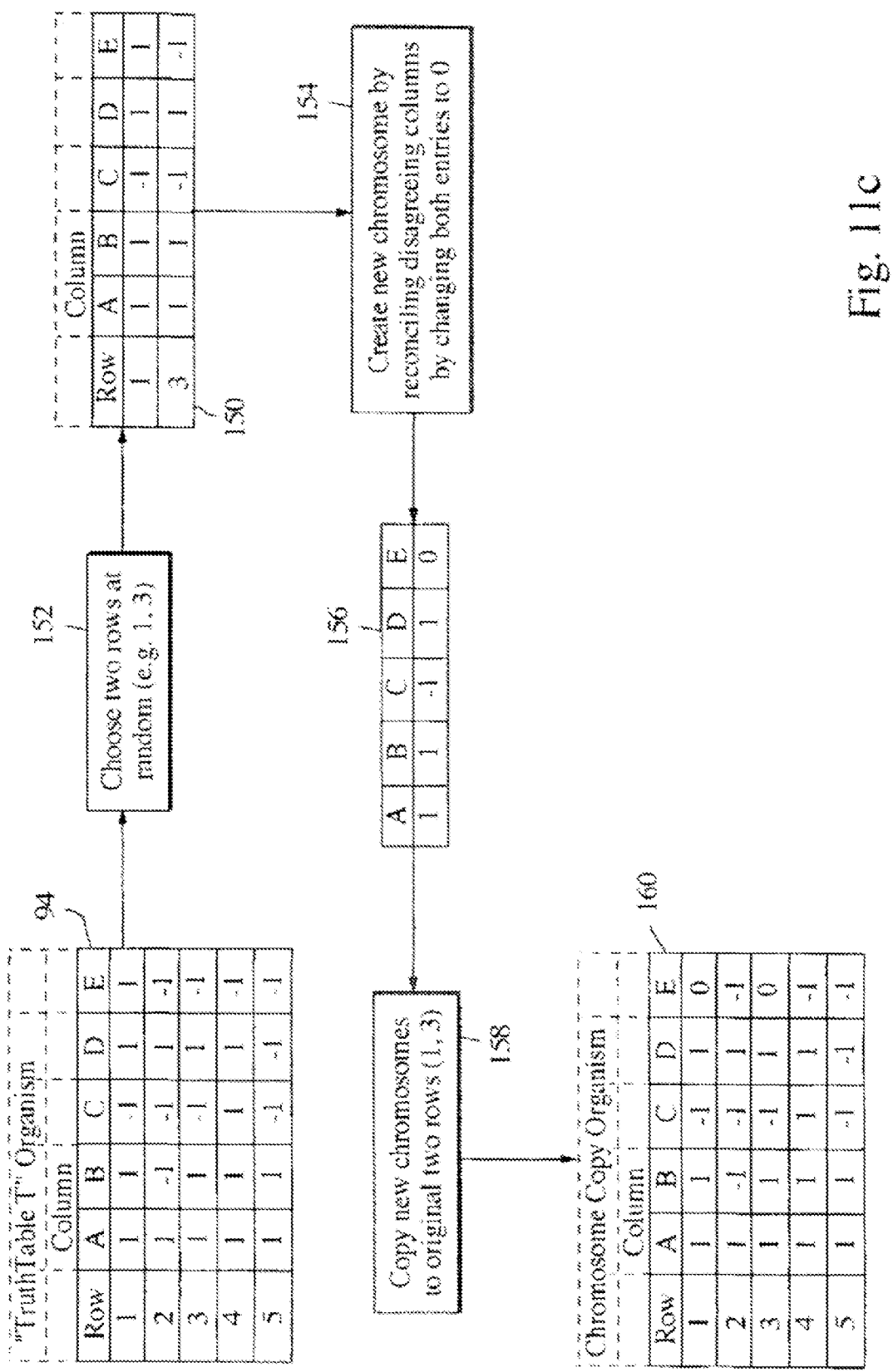

A variety of techniques have been invented for generating an initial population of organisms for use in this genetic scheme as illustrated in FIGS. 11a-11c.

Truth Table T

Since the original T truth table 89 shown in FIG. 7c is known to be a viable but not optimal solution to the binary minimization problem, it is possible to include a copy of a straightforward translation (merely substituting +1 for [true] entries, −1 for [false]) of the truth table as a "seed" member of the organism population at the outset. This results in an organism 94 with every gene in a non-zero state, and every chromosome unique as shown in FIG. 8.

This one-to-one correspondence of truth table T entries and genes in an organism is used to advantage in another respect. Since it is known that each chromosome must always accept the truth table row to which it corresponds (otherwise there would be a risk of failing to represent a required [true] input condition), each chromosome is constantly forced to be consistent with its respective row of truth table entries. This ensures that there is no possibility of an organism evolving that fails to classify a portion of T as such. The way this is implemented in practice is by allowing each gene to take on only the value zero, or the non-zero value corresponding to its T truth table entry.

Mandatory Entry Prototyping

In addition to removing degrees of freedom from the solution space, the array of mandatory entries can be used in creating the initial population of organisms. As depicted in FIG. 11a, the creation algorithm begins by producing a truth table T copy 94 as above, and then operates on a table M 106 to produce a series of chromosomes in a mandatory gene table 110 that prototype the information in M. This is done (step 108) by creating a table the same size as M, but substituting the value "0" for all [false] entries in M, and the value ("1" or "−1") corresponding to the entry in the same location in the seed organism 94 when the M value is [true]. Next, the algorithm chooses several chromosomes at random (step 112), e.g. rows 1 and 3 114. The corresponding rows of the mandatory gene table 110 are then queried, and a new chromosome is created which has all genes set to zero, except those that are in the same position as a mandatory entry in at least one of the random rows (step 116). Those genes are set to the non-zero trinary value in that position. This new chromosome 118 value is then copied to each of the originally selected random rows, as well as any other row which is consistent with the new chromosome (step 120) to produce a mandatory entry prototyping organism 122.

Random Entry Prototyping

Additional initial organisms may be generated based on a single chromosome selected at random. In the process as implemented in FIG. 11b, a truth table T organism 94 is created, then one chromosome (row) 130 is selected at random (step 132), and a random number of its genes are selected as well (step 134). A new chromosome genotype 136 is created by setting all genes to zero, then setting each selected gene to the corresponding value from the T truth table (step 138). Additionally, any mandatory values from the corresponding chromosome 140 in the mandatory gene table 110 are re-imposed on that chromosome 136. Subsequently, this chromosome is copied to any consistent row in the organism (step 142) to produce a random entry prototyping organism 144, and the uniqueness and pointer arrays are updated to reflect the operation.

Chromosome Copy Generation

One additional method of generating the initial population of organisms is shown in FIG. 11c. In this operation we begin with an organism created by the "truth table T" method, and select any two chromosomes 150 at random (step 152). These chromosomes are then reconciled by switching any disagreeing gene values to zero in both chromosomes (step 154). This operation results in one unique chromosome 156 and one duplicate that are copied to the original two rows (158) to produce a chromosome copy organism 160. The uniqueness array and pointer array are updated to match.

Breeding Procedures

The breeding algorithms are all based around the notion of binary asexual reproduction with successive mutation. Several varieties of specialized mutation have been devised for this implementation, but this list is by no means exhaustive.

Binary Asexual Reproduction

Figure 12:
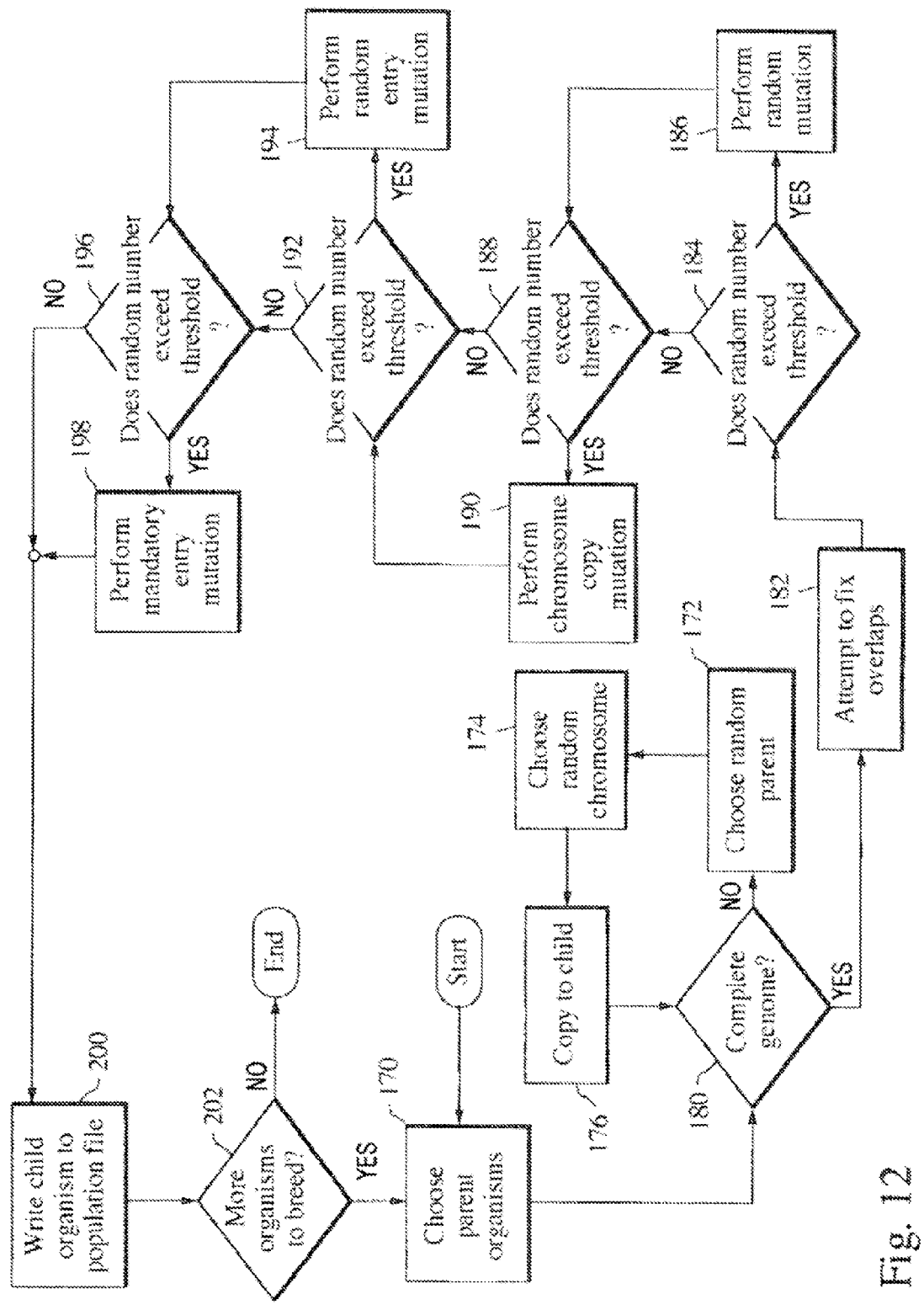
FIG. 12 is a flowchart of the process for breeding organisms.

As shown in FIG. 12, the binary asexual reproduction algorithm begins by assigning parental pairs (step 170). The process is denoted as asexual since any organism can breed successfully with any other (thus there are no genders), and binary because it takes two parents to produce offspring. The breeding scheme is devised to maximize the number of offspring produced by the highest ranked organisms. The top ranked organism breeds with each of the other surviving organisms (typically only organisms in the $90^{th}$ percentile and better are allowed to survive). Each subsequent top ranking organism breeds with successively fewer of the surviving organisms according to the formula (in this implementation) $N_i=M \times D^i/10$; where M is the population, and D is computed to maximize the number of prime breeders. A fairly robust value of D can be computed as: $D=1/\max(1, 1.1245-0.0005 \times \exp(1.6 \times (6-\log(M))))$. The second ranked organism breeds with the next $N_1$ highest ranked organisms ($N_1=M \times D^1/10$); the third breeds with the next $N_2$ below it, and so on. The breeding process occurs once for each pair of parents until the new population (M) has been completely filled out.

One of the parent pair of organisms is selected (step 172) and a unique chromosome is chosen at random from the selected organism (step 174) and copied onto a child organism along with all its relevant copies (step 176). When the child organism has received a complete genome (step 180), the algorithm attempts to fix any spatial overlap in the organism (if forbidden) (step 182). This is done by searching the organism for overlapping non-identical chromosomes and arbitrarily changing a zero gene value that guarantees that the truth table row will only be admitted by one of the chromosomes. While this operation is not guaranteed to produce high scoring, or even viable offspring, it does increase the likelihood of doing so when without the operation the child organism is guaranteed to fail.

To increase the genetic diversity of the offspring, the four different mutation algorithms described below are randomly employed on each child genome. For each, a random number is generated, suitably a uniform random variable between 0 and 1, and compared to a threshold that is based on the likelihood of mutation for that algorithm, e.g. 1—likelihood of mutation (steps 184, 188, 192 and 196)). The likelihood may be constructed as a function of population stability, the more stable the population the greater the likelihood, hence the greater the chance that a mutation will improve the population. If the random number exceeds the threshold, the associated mutation is performed (steps 186, 190, 194 and 198) on the organism or, more specifically, the genes within the organism. Each child organism may be mutated 0, 1, 2, 3 or 4 times, although the probability of mutating any individual organism 4 times is very small. The mutated child organism is then written to a population file (step 200). The process is repeated until the required number of organisms has been produced to complete the population pool (step 202).

Random Genetic Mutation

Random Genetic Mutation is the simplest mutation algorithm utilized in the current implementation. It begins with a child organism constructed via the process of binary asexual reproduction described above. A random genetic mutation considers only a single gene at a time and will toggle the value of that gene to the other permitted value. Recall that the value of any specific gene can only be zero or the value (+/−) 1 that is consistent with the T truth table. Mutation occurs only if a random number is sufficiently high (the threshold used typically starts at 0.9990). Furthermore, as the population stabilizes, the algorithm decreases the threshold for mutation by successive factors of two in order to enhance the chances of finding a slightly better performer in the region of the current gene pool.

Chromosome Copy Mutation

Chromosome copy mutation follows essentially the same procedure as chromosome copying during the initial population generation phase, except that rather than applying the operation to a translated T truth table, it begins with a child genotype. This operation begins by selecting any two unique chromosomes at random. These chromosomes are then reconciled by switching any disagreeing gene values to zero in both chromosomes. This operation results in one unique chromosome and one duplicate; the uniqueness array and pointer array are updated to match. This mutation occurs with an arbitrarily low probability (0.02 in the current implementation). Furthermore, as the population stabilizes, the algorithm increases the threshold for mutation additively in order to enhance the chances of finding a slightly better performer in the region of the current gene pool.

Random Entry Mutation

Another, more complex mutation parallels organism generation by random entry prototyping. In this process, one unique chromosome of a child organism is selected and a random number of its non-zero genes are selected as well. A mutated chromosome genotype is created by setting all unselected non-mandatory genes to zero, and leaving the rest of the genes as they are. Subsequently, this chromosome is copied to any consistent row in the organism, and the uniqueness and pointer arrays are updated to reflect the operation. This mutation occurs with an arbitrarily low probability (0.02 in the current implementation). Furthermore, as the population stabilizes, the algorithm increases the threshold for mutation additively in order to enhance the chances of finding a slightly better performer in the region of the current gene pool.

Mandatory Entry Mutation

The last mutation type is akin to organism generation by mandatory entry prototyping. This algorithm begins by choosing several chromosomes at random in the child organism. The corresponding rows of the mandatory M table are then queried, and a new chromosome is created which has all genes set to zero, except those that are in the same position as a mandatory entry in at least one of the rows corresponding to the randomly selected chromosomes. This new chromosome value is then copied to each of the originally selected random rows, as well as any other row which is consistent with the new chromosome. This mutation occurs with an arbitrarily low probability (0.02 in the current implementation). Furthermore, as the population stabilizes, the algorithm increases the threshold for mutation additively in order to enhance the chances of finding a slightly better performer in the region of the current gene pool.

Zoner Algorithm

The binary minimization algorithm embodied in "Zoner" solves the problem of representing each sub-table as a minimized binary sub-equation with the fewest Boolean terms and input variables required to isolate the T from the F truth table. This is accomplished for each T truth table by forming a parent initial organism using a trinary representation, creating a pool of initial organisms from the parent, breeding the pool until the population stabilizes and then selecting the highest scoring trinary organism as discussed above. The proven theory is that the children of the parents will be better solutions and score higher. This genetic algorithm will converge to the minimized Boolean equation much faster than a random or exhaustive search.

Figure 13:
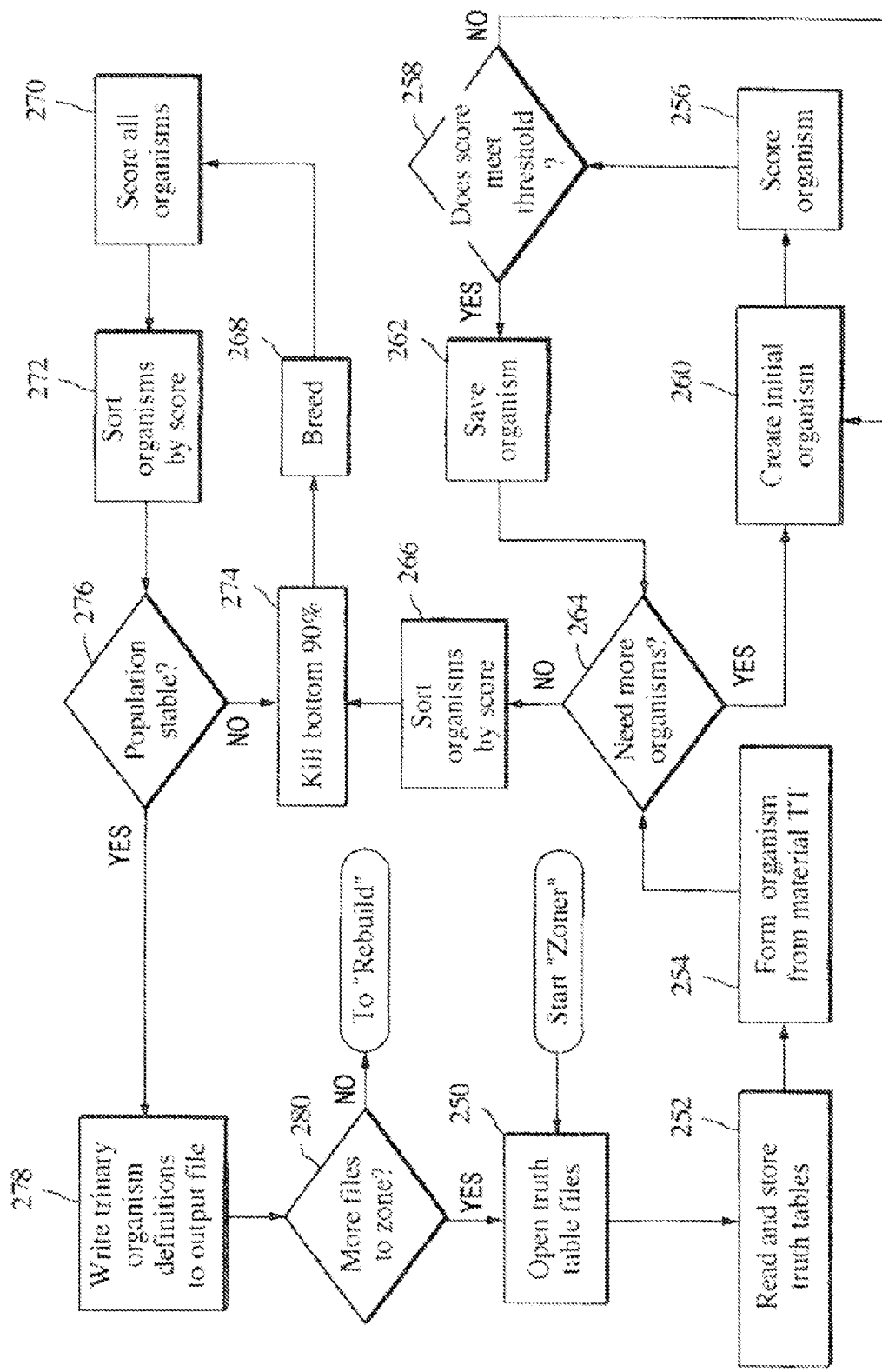
FIG. 13 is a flowchart of the "Zoner" subroutine for solving each sub-table for a minimized sub-equation using a genetic algorithm.

As shown in FIG. 13, "Zoner" opens truth table files (step 250), reads in and stores the truth table files (step 252) and then enters a loop which will create an initial population of organisms, beginning with one formed directly from the T truth table (step 254). This organism is formed by mapping each T table entry to a "1" and each false table entry to a "−1". An initial pool of organisms is created by duplicating the parent and changing some of the +1, −1 values to 0s according to the above procedures. As the pool of organisms totaling one tenth the size of the entire eventual population is formed, each organism is scored in succession (step 256). If an organism would permit an entry from the F table it is assigned a score of zero. Otherwise the score is computed as the number of total entries in the organism minus the number of non-zero entries, this quantity is divided by the number of unique rows, and finally added to one. Thus, an organism that has few rows and many zeros without admitting a false entry has a very high score. Any organism that fails to meet a threshold score (step 258) is not saved, and a replacement is immediately generated (step 260).

When a sufficient quantity of organisms has been created and saved (steps 262, 264), the organisms are sorted (using, for example, the common sort routine, Heapsort) by score (step 266). In later passes through the loop, the bottom 90% of the organisms are destroyed (step 268), but the first time through the loop, only 10% of the overall pool has been created, so no organisms are destroyed. The pool is then filled out by the breeding procedures (step 268) such as asexual binary reproduction or various mutation techniques. At this point the algorithm commences its main task: scoring (step 270), ranking (step 272), killing (step 274) and breeding (step 268) repeatedly, until the population demonstrates stability (step 276).

The method used for ranking the performance of various organisms ("scoring") makes use of the calculable properties of the organisms. The number of unique chromosomes corresponds directly to the number of terms used in the Boolean equation, this number should be minimized. The number of non-zero genes in unique chromosomes corresponds to the total number of input variables used in the Boolean equation, which should also be minimized. Any occurrence of overlap is highly undesirable in an organism in the variant implementation. In the exemplary algorithm each organism is scored as follows: the number of non-zero genes in unique chromosomes is subtracted from the total number of genes in the organism. This quantity is divided by the total number of unique chromosomes. The total score is one plus the previous quantity, unless the organism has been determined to be non-viable due to acceptance of an F row, or in the case of the combinatorial geometry variant, the presence of overlaps, in which case the score is set to zero. Maximizing this score results in the best possible minimized binary equation in this implementation, although there are other scoring methods which are known to work as well.

"Population stability" is defined as a combination of the lack of variation in the score of the survivors, and the repetition of the same top score in several successive generations. Stability is guaranteed to be achieved with a successful result, however, it may or may not be the case that the result encountered is reasonably approaching the optimal solution. This potential for suboptimal solutions is significantly mitigated by the bisection approach of the overall algorithm. Once stabilized, Zoner writes the trinary organism definition to an output file (step 278) and determines whether there are more files to operate upon (step 280).

Rebuild

Solutions to each miniature optimization problem can be stated in a truth-table analog format that serves to simplify the bookkeeping when two sub-level truth tables are reunited. In this form, the row-column format is preserved with one-to-one correspondence, but the entries in the table are trinary data corresponding to [true], [n/a], and [false], e.g. (1,0,−1) respectively. In order to preserve the number of rows in an optimized solution, multiple copies of any term that comprises a solution for more than one row are made in the solution table. This doesn't mean that the solution actually contains as many terms as there are rows in the truth table, as any duplicate solution rows actually are representative of only a single solution term.

Reuniting two lower level truth tables is not necessary if intermediate tables are stored during the bisection process. Each of these higher level truth tables is a fresh problem statement in it own right, but using the two solution tables for the lower level truth tables will yield a solution for the higher level problem, but it is now possible to further optimize the solution at the higher level. The solution tables are combined by interleaving the solution rows into their appropriate positions (recalling that the higher level truth table was broken in two by dividing rows into two groups, and that each solution row corresponds directly to a lower level truth table row) and filling any missing columns with the [n/a] trinary correlate (0). Using this new solution table as a starting point, optimization is typically greatly simplified, frequently by orders of magnitude in computation time.

The solution and solution reunification procedure is applied to successively higher levels of truth tables, replicating the bisection procedure in reverse. For very complicated problems it may occur that as the truth tables get increasingly large the payoff in terms of optimization isn't worth the increased solution time. This solution procedure is quite amenable to premature termination, as any intermediate solution is an effective solution (and often a highly optimized solution) of the overall problem. It is only necessary in this case to combine all of the highest level solution tables according to the above procedure, and an effective solution can be established. The reunification and higher level solution process is also independent from pair to pair, so it is also quite simple to implement as a parallel algorithm if desired.

Figure 14:
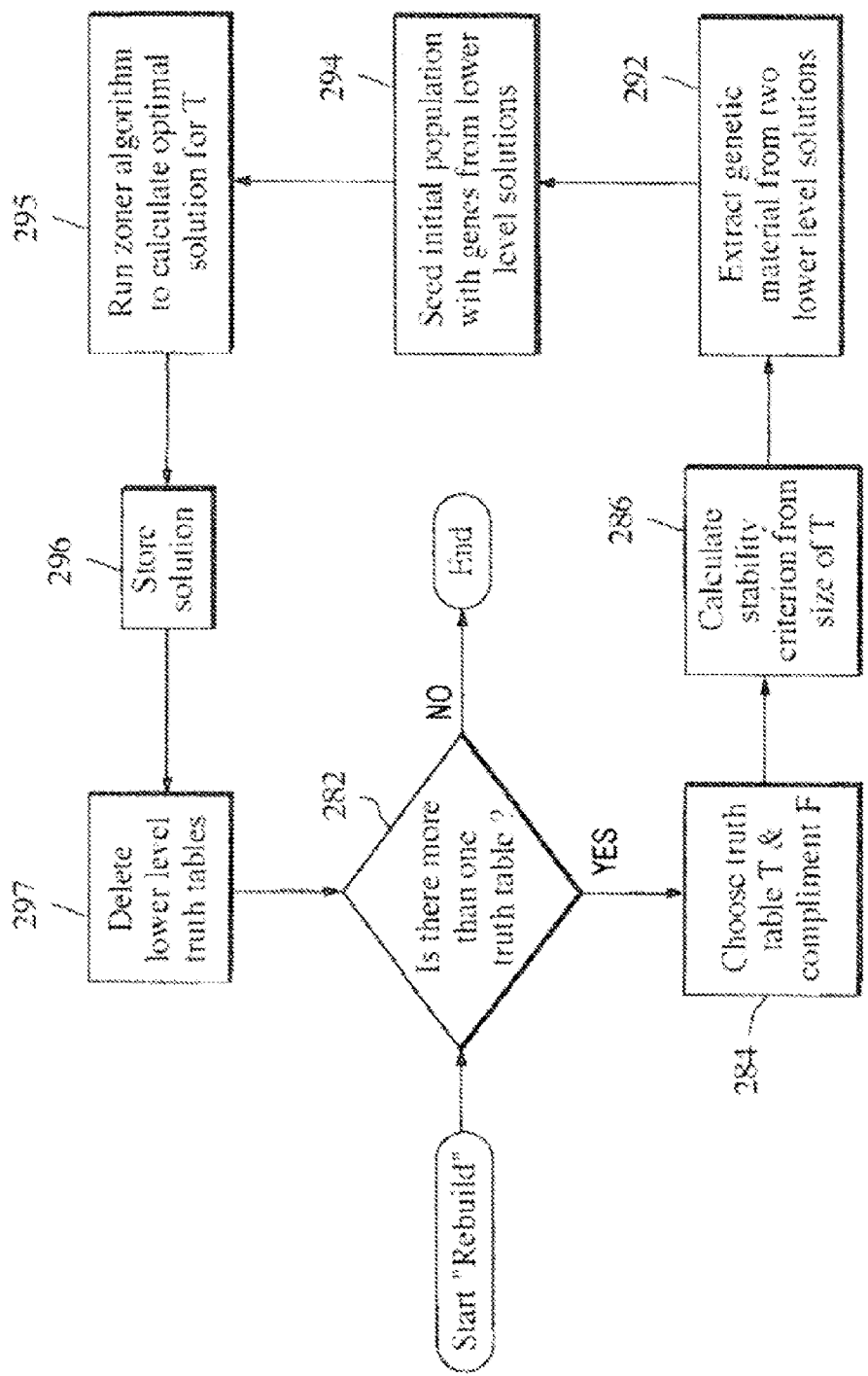
FIG. 14 is a flowchart of the "Rebuild" subroutine for regressing back through the decomposition to solve the minimized sub-equations at higher and higher levels.

The exemplary algorithm that implements the above logic is presented in FIG. 14. In this procedure, the loop structure begins with a tree of truth tables produced by iterative bisection and simplification, where only the lowest levels of each branch have been solved. The procedure terminates when all the sub-level truth tables have been collected by binary recombination, and an overall solution has been calculated (step 282). With each pass through the loop, a pair of complementary truth tables (T and F) from the next highest unsolved level is chosen (step 284). It has been found that as the size of T increases, the length of time it takes to compute new solutions increases dramatically. Furthermore, it has been found that the likelihood of substantive improvements in the solution decreases with the size of T when lower level solutions are provided. Therefore, the current implementation decreases the tolerance value for solution stability as T increases, so that inordinate amounts of time aren't spent when improvements are unlikely and costly to compute (step 286).

Figure 15:
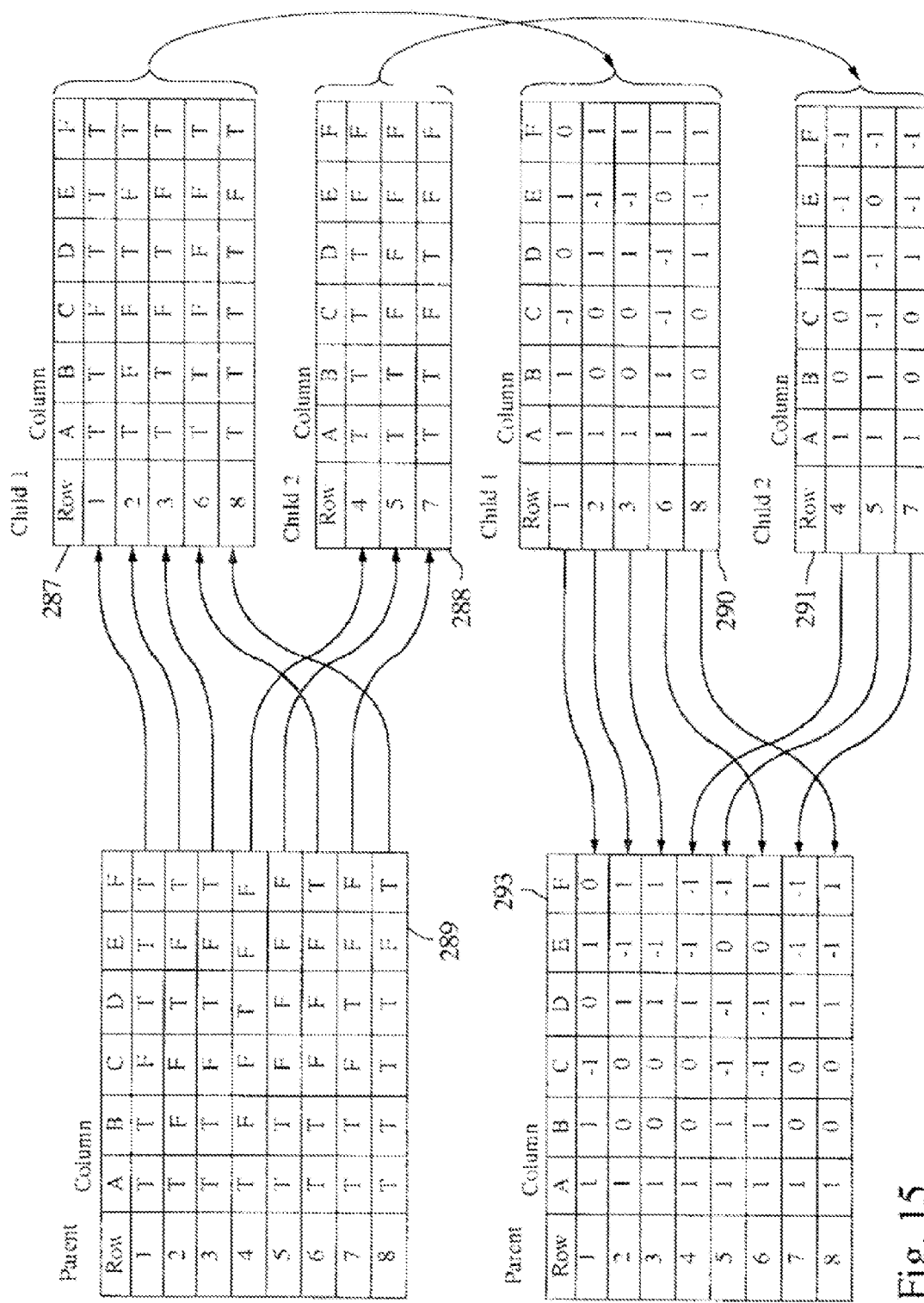
FIG. 15 is a diagram of a parent sub-table, its children and their minimized sub-equations, and the resulting parent organism.

The solution procedure begins, as shown in FIG. 15, by identifying the two lower level solution tables 287, 288 (from the solutions for TA and TB) for the T truth table 289 and extracting the genetic information from those solutions, reformulating them to meet the requirements of the higher level truth table by adding zeros within each row corresponding to any eliminated columns, and interleaving the rows of the solutions 290,291 to match T (step 292). The genes of this tentative solution are used to create a parent organism 293 to seed the population of the genetic organisms representing the solution for T (step 294). Next, the Zoner algorithm is used in concert with the pre-determined tolerance value and the trial solutions to genetically improve the proposed solution (step 295). When the tolerance value is achieved, the solution is stored (step 296), and the lower level truth tables are deleted or flagged as solved (step 297). When the solution is complete for T, the loop continues by identifying the next lowest level unsolved truth table.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A method of digital logic circuit design, comprising:
    a) Storing a complementary pair of truth tables T and F in a computer, said truth tables representing an initial configuration of logic gates to map from logic inputs to a single bit output of a digital logic circuit;
    b) Iteratively subdividing the T truth table into pairs of sub-tables along branches at progressively lower levels until the remaining sub-tables are smaller than a threshold size;
    c) Using a genetic algorithm to solve each of the sub-tables at the lowest level independently from respective seed organisms as a sub-solution;
    d) For each pair of sub-tables at the lowest remaining level, combining their sub-solutions to form the seed organism to seed the genetic algorithm to solve the sub-table at the next higher level up the branch and refine the sub-solution; and
    e) Repeating step (d) at least once to generate a solution; and
    f) Storing the solution in the computer, said solution representing a configuration of logic gates for the digital logic circuit to map the logic inputs to the single bit output that requires fewer gates than said initial configuration.

2. The method of claim 1, wherein the T truth table is iteratively subdivided by, Selecting the T truth table, its complement F truth table, and an associated mandatory table M;

Selecting a bisection column;

Generating sub-tables TA, TB for the T truth table at the bisection column;

Generating the complement sub-tables FA, FB;

Splitting the M table into sub-tables MA, MB at the bisection column;

Simplifying the sub-tables, the complements and the M sub-tables; and

Repeating the process recursively for each sub-table until they are smaller than the threshold size.

3. The method of claim 2, wherein the mandatory table M is created by:

Generating a new truth table with the same dimensions as T and all values defaulting to false;

Comparing each row $T_i$ of T in turn to every row $F_j$ of F to find each occurrence where every column in the rows being compared is the same except a single column "m"; and Setting the entry $M_{i,m}$ to true wherever that condition occurs.

4. The method of claim 3, wherein the mandatory table M is created using binary trees.

5. The method of claim 2, wherein the bisection column is the column that most closely splits the number of true values evenly between sub-tables TA and TB.

6. The method of claim 2, wherein the bisection column is selected by:

determining the number of true entries in the M table corresponding to the T truth table to be bisected;

identifying those columns that have more than mean number of true M entries; and from this subset of columns, selecting the bisecting column that most nearly divides the T truth table into two equally sized groups of rows.

7. The method of claim 2, wherein the sub-tables are simplified by,

Eliminating duplicate rows,

Removing unnecessary columns, and

Eliminating any remaining duplicative rows.

8. The method of claim 7, wherein duplicate rows are eliminated using a binary tree formation operation to collapse duplicate rows as they are encountered.

9. The method of claim 7, wherein unnecessary columns are removed by using a binary tree to compare rows of T and F positing the absence of a column and deleting columnar data whenever doing so is not precluded by the need to differentiate tables T and F.

10. The method of claim 1, wherein the seed organism comprises a number of chromosomes each having a number of genes, the genetic algorithm solving the sub-tables by, Creating a pool of organisms having a trinary format in which a +1 value represents true, −1 represents false and 0 represents true or false from the seed organism by setting some of the genes to a 0 value for a plurality of different organisms;

Scoring the organisms, eliminating low scoring organisms, and breeding the remaining organisms in the pool until the scores of the remaining population of organisms stabilize;

Selecting the highest scoring organism; and

Storing the sub-solution from the selected organism.

11. The method of claim 10, wherein the seed organism for solving the sub-tables at the lowest level in step (c) is binary and is formed by, Opening a T sub-table and its complement F sub-table, said T sub-table comprising a number of rows having true and false entries; and Mapping the true and false entries from the T sub-table to 1 and −1 values, respectively, for the corresponding genes in the chromosomes.

12. The method of claim 10, wherein the seed organism formed in step (d) for solving the sub-tables at the next highest levels has a trinary format.

13. The method of claim 10, wherein mandatory random prototyping determines the genes to be set to 0 by:

Computing a table of mandatory entries including those T sub-table entries that singularly prevent confusion of a T sub-table row with an F sub-table row;

Selecting a number of chromosomes in the seed organism; and

Setting at least some of the non-mandatory genes in each selected chromosome to 0 to form a new organism.

14. The method of claim 13, wherein the number of chromosomes in the seed organism are selected randomly.

15. The method of claim 13, wherein all of the non-mandatory genes in each selected chromosome are set to 0.

16. The method of claim 10, wherein random entry prototyping determines the genes to be set to 0 by:

Computing a table of mandatory entries including those T sub-table entries that singularly prevent confusion of a T sub-table row with an F sub-table row;

Selecting a chromosome in the seed organism;

Selecting a number of genes from the chromosome;

Forming a new chromosome of the selected genes from the chromosome and the non-selected entries from the corresponding row in the table of mandatory entries; and Substituting the new chromosome for any chromosomes in the seed organism whose genes do not contradict the genes of the new chromosome.

17. The method of claim 10, wherein chromosome copy generation determines the genes to be set to 0 by:

Selecting first and second chromosomes from the seed organism;

Setting any genes that are different in the two rows to 0; and

Copying the first and second chromosomes back to the seed organism to form a new organism.

18. The method of claim 10, wherein each organism is scored as a function of the number of unique chromosomes and the number of non-zero genes.

19. The method of claim 18, wherein the score is the total number of genes in the unique chromosomes minus the number of non-zero genes in the unique chromosomes divided by the number of unique chromosomes.

20. The method of claim 10, wherein if each unique chromosome in the organism rejects each row in the F sub-table that organism is viable and may stay in the pool.

21. The method of claim 10, wherein the pool of organisms are bred by:

Selecting a pair of parent organisms from the pool;

Using a binary asexual reproduction algorithm to create a child organism; and

Randomly mutating the child organism.

22. The method of claim 21, wherein the child organism is created by:
Choosing one of the pair of parent organisms,
Choosing a chromosome from the chosen parent,
Copying the chromosome to the child organism, and
Repeating until the child organism is complete.

23. The method of claim 21, wherein the child organism is mutated by randomly performing any of a random, chromosome copy, random entry or mandatory entry mutation.

24. The method of claim 1, wherein the combination of the sub-solutions forms the seed organism having a trinary format of 1, −1, and 0 corresponding to T, F and either T or F, respectively the
genetic algorithm creating a pool of initial organisms from the seed; breeding the pool until the population stabilizes; selecting the highest scoring trinary organism; and storing the sub-solution for the selected trinary organism.

25. The method of claim 1, wherein step (d) is repeated until the entire T truth table has been reunited.

26. The method of claim 1, wherein the genetic algorithm creates a pool of organisms having a plurality of chromosomes with gene entries of 1, −1, and 0 representing T, F and either T or F and scores each organism as a function of the number of unique chromosomes and the number of non-zero genes to solve each sub-table.

27. The method of claim 1, wherein the seed organisms provided to the genetic algorithm are valid solutions and the genetic algorithm only provides valid sub-solutions for the sub-tables thereby ensuring that the solution is a valid.

28. A method of digital logic circuit design, comprising:
a) Storing a complementary pair of truth tables T and F in a computer, said truth tables representing an initial configuration of logic gates to map from logic inputs to a single bit output of a digital logic circuit;
b) Recursively bisecting the T truth table into pairs of sub-tables along branches at progressively lower levels until the remaining sub-tables are smaller than a threshold size;
c) Using a genetic algorithm to solve the T sub-tables at the lowest level independently as a sub-solution, said genetic algorithm forming a binary seed organism from the T sub-table, creating a pool of trinary organisms by setting some of the genes in the seed organism to 0 representing either T or F, eliminating low scoring organisms and breeding the organisms until the scores stabilize, and selecting a high scoring organism for the sub-solution;
d) For each pair of sub-tables at the lowest remaining level, combining their sub-solutions to form a trinary seed organism to seed the genetic algorithm to solve the sub-table at the next higher level up the branch and refine the sub-solution,
e) Repeating step (d) at least once to recursively generate a solution; and
f) Storing the solution in the computer, said solution representing a configuration of logic gates for the digital logic circuit to map the logic inputs to the single bit output that requires fewer gates than said initial configuration.

29. The method of claim 28, wherein mandatory random prototyping determines the genes to be set to 0 by:
Computing a table of mandatory entries including those T sub-table entries that singularly prevent confusion of a T sub-table row with an F sub-table row;
Selecting a number of chromosomes in the seed organism; and
Setting at least some of the non-mandatory genes in each selected chromosome to 0 to form a new organism.

30. The method of claim 28, wherein random entry prototyping determines the genes to be set to 0 by:
Computing a table of mandatory entries including those T sub-table entries that singularly prevent confusion of a T sub-table row with an F sub-table row;
Selecting a chromosome in the seed organism;
Selecting a number of genes from the chromosome;
Forming a new chromosome of the selected genes from the chromosome and the non-selected entries from the corresponding row in the table of mandatory entries; and
Substituting the new chromosome for any chromosomes in the seed organism whose genes do not contradict the genes of the new chromosome.

31. The method of claim 28, wherein chromosome copy generation determines the genes to be set to 0 by:
Selecting first and second chromosomes from the seed organism;
Setting any genes that are different in the two rows to 0; and
Copying the first and second chromosomes back to the seed organism to form a new organism.

32. The method of claim 28, wherein each organism is scored as a function of the number of unique chromosomes and the number of non-zero genes.

33. The method of claim 28, wherein if each unique chromosome in the organism rejects each row in the F sub-table that organism is viable and may stay in the pool.

34. The method of claim 28, wherein the pool of organisms are bred by:
Selecting a pair of parent organisms from the pool;
Using a binary asexual reproduction algorithm to create a child organism; and
Randomly mutating the child organism.

35. The method of claim 28, wherein step (d) is repeated until the entire T truth table has been reunited.

36. The method of claim 28, wherein the genetic algorithm creates a pool of organisms having a plurality of chromosomes with gene entries of 1, −1, and 0 representing T, F and either T or F and scores each organism as a function of the number of unique chromosomes and the number of non-zero genes to solve each sub-table.

37. The method of claim 28, wherein the seed organisms provided to the genetic algorithm are valid solutions and the genetic algorithm only provides valid sub-solutions for the sub-tables thereby ensuring that the solution is a valid.

* * * * *